(12) United States Patent
Hodder (10) Patent No.: US 7,509,526 B2
(45) Date of Patent: Mar. 24, 2009

(54) METHOD OF CORRECTING NAND MEMORY BLOCKS AND TO A PRINTING DEVICE EMPLOYING THE METHOD

(75) Inventor: Leonard B. Hodder, Toronto (CA)

(73) Assignee: Seiko Epson Corporation, Tokyo (JP)

( * ) Notice: Subject to any disclaimer, the term of this patent is extended or adjusted under 35 U.S.C. 154(b) by 991 days.

(21) Appl. No.: 10/949,869

(22) Filed: Sep. 24, 2004

(65) Prior Publication Data
US 2006/0072157 A1    Apr. 6, 2006

(51) Int. Cl.
*G06F 11/22* (2006.01)
(52) U.S. Cl. .......................................... 714/8; 714/710
(58) Field of Classification Search ...................... 714/5, 714/42, 710, 8; 365/200
See application file for complete search history.

(56) References Cited

U.S. PATENT DOCUMENTS

| | | | | |
|---|---|---|---|---|
| 5,200,959 A | * | 4/1993 | Gross et al. .................. | 714/723 |
| 5,359,569 A | * | 10/1994 | Fujita et al. .................. | 365/229 |
| 5,471,478 A | * | 11/1995 | Mangan et al. .............. | 714/711 |
| 6,041,001 A | | 3/2000 | Estakhri | |
| 6,405,323 B1 | * | 6/2002 | Lin et al. ........................ | 714/8 |
| 6,523,132 B1 | | 2/2003 | Harari et al. | |
| 6,560,725 B1 | * | 5/2003 | Longwell et al. .............. | 714/54 |
| 6,684,345 B2 | | 1/2004 | Harari et al. | |
| 6,725,321 B1 | * | 4/2004 | Sinclair et al. ............... | 711/103 |
| 6,751,766 B2 | * | 6/2004 | Guterman et al. ........... | 714/736 |
| 6,918,645 B2 | * | 7/2005 | Takahashi ..................... | 347/16 |
| 6,957,295 B1 | * | 10/2005 | Estakhri ....................... | 711/103 |
| 7,012,835 B2 | * | 3/2006 | Gonzalez et al. ........ | 365/185.11 |
| 7,027,172 B1 | * | 4/2006 | Parulski et al. .............. | 358/1.15 |
| 7,084,954 B2 | * | 8/2006 | Kito .............................. | 355/40 |
| 7,120,729 B2 | * | 10/2006 | Gonzalez et al. ............ | 711/103 |
| 7,188,228 B1 | * | 3/2007 | Chang et al. ................. | 711/202 |
| 7,193,899 B2 | * | 3/2007 | Eggleston et al. ....... | 365/185.29 |
| 2002/0069381 A1 | | 6/2002 | Jeong et al. | |
| 2003/0167372 A1 | | 9/2003 | Lee | |
| 2004/0015771 A1 | | 1/2004 | Lasser et al. | |
| 2004/0042331 A1 | | 3/2004 | Ikehashi et al. | |

* cited by examiner

*Primary Examiner*—Stephen M Baker
(74) *Attorney, Agent, or Firm*—Mark P. Watson (57) ABSTRACT

A printing device comprises memory storing data in blocks and a processing unit communicating with the memory and being responsive to print jobs. In response to a print job, the processing unit accesses the memory and extracts data therein to be used to complete the print job. The processing unit performs a data block correcting procedure during printing device idle times.

19 Claims, 5 Drawing Sheets

METHOD OF CORRECTING NAND MEMORY BLOCKS AND TO A PRINTING DEVICE EMPLOYING THE METHOD

FIELD OF THE INVENTION

The present invention relates generally to printing devices and in particular, to a method of correcting NAND memory blocks and to a printing device employing the method.

BACKGROUND OF THE INVENTION

Stand-alone electronic cash registers including payment card readers and receipt printers have been used for years in stores, retail outlets and service outlets to facilitate the completion of cash, cheque, credit card or debit card transactions for the purchase of goods and/or services. With the advent of sophisticated and inexpensive computing equipment, input devices and secure communication networks, point-of-sale (POS) stations have become an increasingly popular alternative.

POS stations typically include a host device and a plurality of interchangeable peripherals connected to the host device. The host device and peripherals are easily integrated allowing the configuration of POS stations to be modified to meet changing needs. This has been another factor leading to their widespread acceptance. The host device is commonly in the form of a personal computer. The peripherals often include a keyboard, a display screen, a cash drawer, a printing device, a payment card reader and a barcode reader. In some cases, a touch-sensitive display screen is used instead of separate keyboard and display screen peripherals.

As is well known, the host device communicates with the peripherals and executes software to allow product and/or service transactions to be completed. When payment is effected using a debit or credit card, the host device establishes a connection to the appropriate financial institution over an information network so that approval for the transaction may be obtained. Upon completion of any transaction, the host device creates and transmits a print job to the printing device causing the printing device to generate a transaction receipt and a possibly signing receipt, if payment is made using a credit card.

In larger stores, retail outlets and service outlets, POS stations are typically linked via a local area network and communicate with a backend computing device that maintains a database for transaction, inventory, accounting, sales, tax, etc. information. Transaction data received by each of the POS stations is conveyed to the backend computing device for storage in the database allowing all transaction data to be stored in a common location. Collectively storing all transaction data in one common location allows retailers to track, account for and maintain inventory, collected taxes and pricing information. Also, by linking the POS stations, updates relating to sales on products and/or services, tax, etc. can be communicated to each POS station over the local area network avoiding the need to update the POS stations one at a time.

Printing devices commonly used in POS stations comprise a printer having a slot for receiving a separate printer interface that controls communications between the host device and the printer. The printer interface is primarily selected based on the communication protocol used by the host device thereby to ensure hardware compatibility between the host device and the printer. For example, hardware compatibility may be achieved by installing a serial, parallel, Ethernet or USB interface into the printer slot. As the printer interface can be readily changed, the printer is not limited for use with any particular communication protocol but rather can be used in many different communication protocol environments simply by replacing the printer interface. The printer interface may also be selected to enhance functionality of the printer such as by adding supplemental fonts or by emulating one or more other printer models.

The printer interface and the printer are typically preloaded with firmware although the printing device may receive updated printer firmware from the host device to replace or patch the existing printer firmware. Updated printer firmware received from the host device by the printer interface is in turn conveyed to the printer for storage therein.

The printer firmware typically includes a boot file, a main firmware file and one or more font files. The boot file is executed by the printer during initialization to place the printer into a ready operating state. The main firmware and font files are executed during normal operation of the printer to allow the printer to respond to print commands received from the host device via the printer interface so that appropriate transaction receipts can be printed. The font file typically contains glyph or shape data for each character in the font file character sets.

NAND memory is commonly employed in the printer interface and printer to store the firmware, print data stream character codes and commands and other information. NAND memory is divided into blocks with each block including a plurality of sectors. Each sector typically accommodates 512 bytes of data and 16 bytes of memory management code such as for example error detection code (EDC)/error correction code (ECC). Unfortunately, NAND memory, like all memory, is not 100% reliable. When writing data blocks to blocks of NAND memory, it is possible that the data blocks are written incorrectly, referred to as sector write failures. As a result, it is necessary to verify written data blocks to confirm that the writes are successful. Also, blocks of data written to NAND memory while initially correct may become erroneous over time due to aging or due to disturbances resulting from writes to adjacent blocks of NAND memory.

To deal with memory problems, techniques to detect and correct memory errors have been considered. For example, U.S. Pat. No. 6,041,001 to Estakhri discloses a method of increasing data reliability of a flash memory device using "on the fly" detection and correction of data errors and bad memory blocks. An error correction code (ECC) is stored along with the data at write time. Memory units are checked and corrected when a read of the data is corrected. Compatibility with existing memory products and formats is not compromised through use of a permissible variation in the Solid State Floppy Disk Card (SSFDC) standard in order to achieve both increased error correction capability and sufficient compatibility.

U.S. Pat. Nos. 6,523,132 and 6,684,345, to Harari et al. disclose increasing the reliability of flash EEPROM memory in order to bring it into line with the level of reliability of typical magnetic disk storage. A defect mapping table is used to re-correct for hard errors whenever they occur by re-mapping the memory cell-by-cell where necessary. Hard errors are detected by their failure to program or erase correctly and, upon read, are detected by making use of an ECC. Once an error is identified, defect mapping is applied, with the aim to preserve sequential addressing. If a failure is detected during writing to memory, a backup is immediately created.

U.S. Patent Application Publication No. 2002/0069381 to Jeong et al. discloses a non-volatile semiconductor memory device with a fail bit detecting scheme that detects the number of fail bits in a memory block in order to determine the usability of the memory block. In a special test mode, test data is stored and compared to read test data. The number of failed bits determined from the comparison is used to provide a measure of the reliability and therefore, usability of the memory device.

U.S. Patent Application Publication No. 2003/0167372 to Lee discloses a semiconductor memory device with a flexible redundancy scheme and automatic bad block mapping. An address storage circuit contains the addresses of bad memory blocks. The address storage circuit receives the address of a block of memory required to be read or written to, and automatically switches address selection between a normal and redundant block if the received address corresponds to a bad block of memory.

U.S. Patent Application Publication No. 2004/0015771 to Lasser et al. discloses a method for correcting errors in both data and corresponding data control portions of non-volatile memory using a shared error code. The method takes into account the fact that control information may also contain errors and seeks to increase the usability of low-reliability memory. A shared code is used, in some cases, to lengthen access time to control information.

U.S. Patent Application Publication No. 2004/0042331 to Ikehashi et al. discloses a semiconductor memory device with a test mode. Test time is reduced during manufacture of the semiconductor memory device by eliminating a "fuse cutting" step from the test procedure.

Although the above references disclose memory correcting techniques, improved methods of managing printer memory are desired. It is therefore an object of the present invention to provide a novel method of correcting NAND memory blocks and to a printing device employing the method.

SUMMARY OF THE INVENTION

Accordingly, in one aspect of the present invention there is provided a printing device comprising memory storing data in blocks and a processing unit communicating with the memory and being responsive to print jobs. In response to a print job, the processing unit accesses the memory and extracts data therein to be used to complete the print job. The processing unit performs a data block correcting procedure during printing device idle times.

In one embodiment, during the data block correcting procedure, the processing unit examines sectors of the memory and uses error correcting code stored in the sectors to detect bad sectors. Data blocks with bad sectors are corrected. During correction of a data block with a bad sector, the processing device copies the data block to a new location, erases the original data block, uses the error correcting code to correct the bad sector and rewrites the corrected data block to its original location. The processing device may further verify the re-written data block to ensure it has been properly re-written. If the re-written data block is not properly re-written, the processing device writes the corrected data block to a new location. In this case, the processor further flags the location of the original data block as a bad block of memory.

According to another aspect of the present invention there is provided a printing device comprising memory storing data in blocks and storing memory block status information. A processing unit communicates with the memory and is responsive to print jobs. In response to a print job, the processing unit accesses the memory and extracts data therein to be used to complete the print job. During writing of data to the memory, the processing unit uses the memory block status information so that data is only written to good blocks of memory during writing. The processing unit readjusts pointers in the data to be written to take into account bad blocks of memory that are skipped during writing.

The memory block status information is updated upon writing data to blocks of memory to identify used blocks. Bad and used blocks are skipped during writing. The memory block status information is stored in a table that is created when the memory is first used thereby to identify bad memory blocks before any writing is performed.

The memory block assessing and correcting procedure provides advantages in that data stored in memory blocks is generally continuously examined to detect correctable errors. Such correctable errors are dealt with before the errors become too severe to recover the data. Also, since pointers in data to be written to blocks of memory are readjusted prior to writing to take into account skipped bad blocks, during readout, the stored data can be retrieved and processed quickly as no pointer adjustments need to be made.

BRIEF DESCRIPTION OF THE DRAWINGS

An embodiment will now be described more fully with reference to the accompanying drawings in which.

DETAILED DESCRIPTION OF THE EMBODIMENTS

Figure 1:
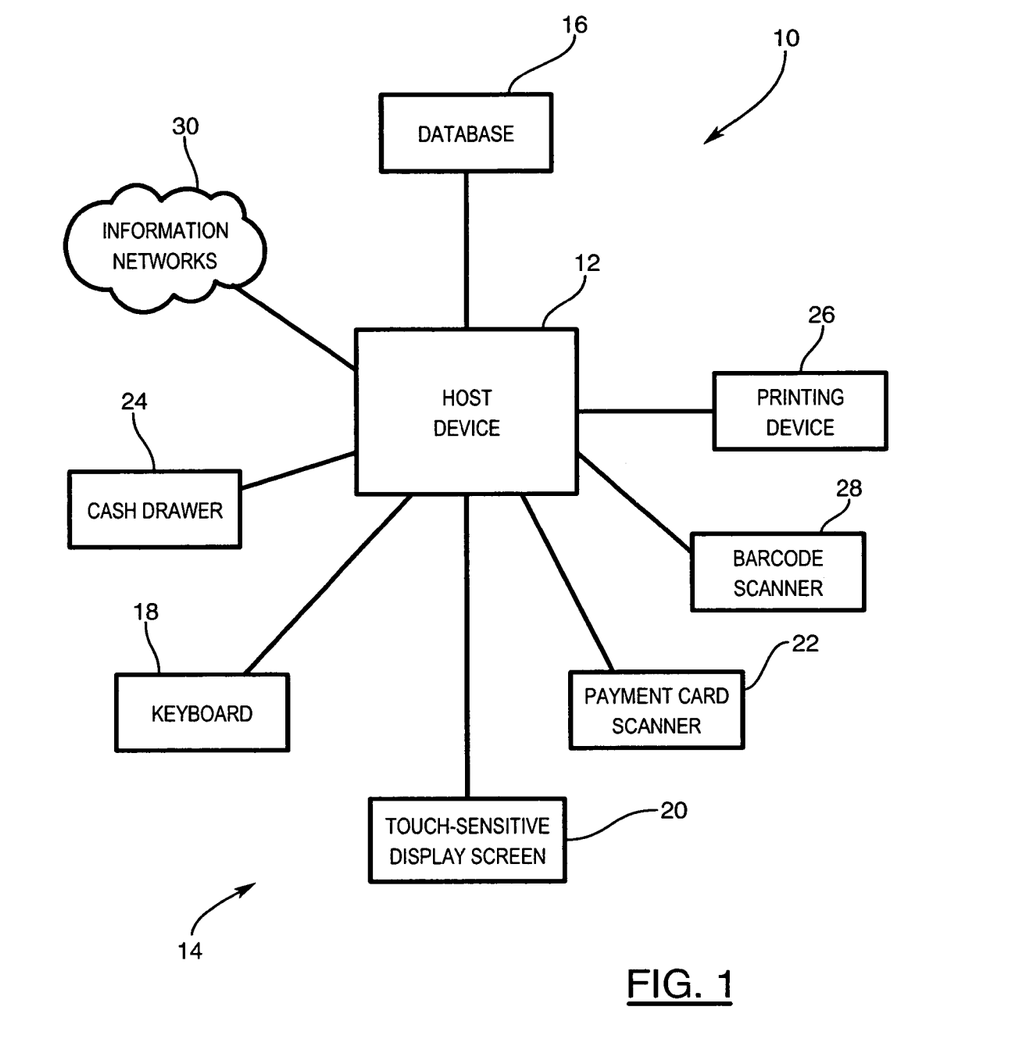
FIG. 1 is a schematic block diagram of a point-of-sale station including a printing device.

Turning now to FIG. 1, a point-of-sale (POS) station is shown and is generally identified by reference numeral 10. As can be seen, POS station 10 includes a microprocessor-based host device 12 in the form of a personal computer that communicates with a plurality of peripherals generally identified by reference numeral 14 and with a database 16 storing transaction, inventory, pricing, tax and accounting information. In this example, peripherals 14 include a keyboard 18, a touch-sensitive display screen 20, a payment card scanner 22, a cash drawer 24, a printing device 26 and a barcode scanner 28. Host device 12 also communicates with financial institutions (not shown) such as banks and credit card companies over one or more information networks generally identified by reference numeral 30.

Figure 2:
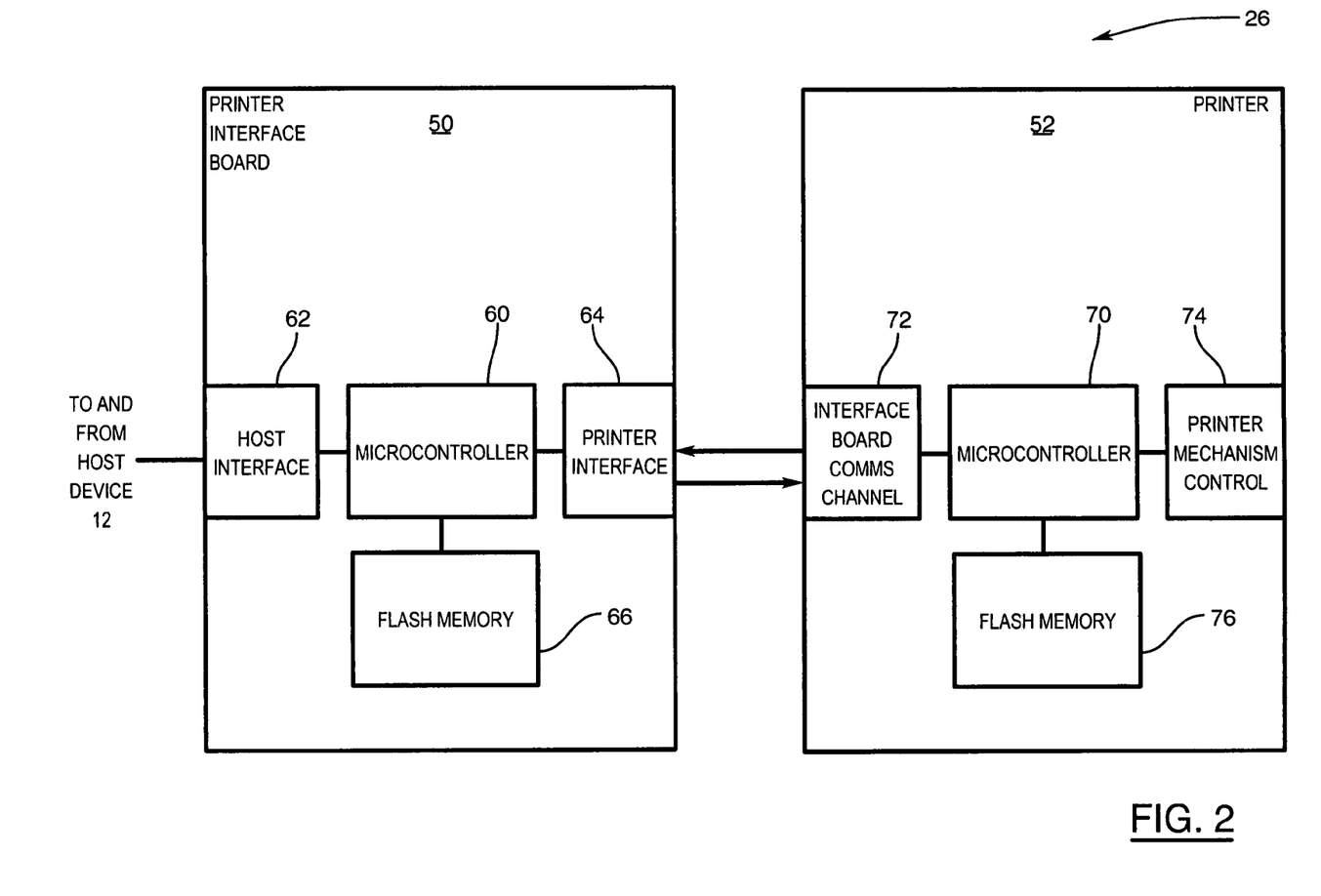
FIG. 2 is a schematic block diagram of the printing device of FIG. 1.

Printing device 26 is best illustrated in FIG. 2 and includes a printer interface 50 and a printer 52. Printer interface 50 comprises a microcontroller 60, a host interface board 62, a printer interface board 64 and non-volatile flash memory 66. Printer 52 comprises a microcontroller 70, a communications channel interface board 72, a printer control mechanism 74 and non-volatile flash memory 76. For example, the printer interface 50 may be of the type sold by EPSON under model No. UB-EML and the printer 52 may be of the type sold by EPSON under model No. TM-U200.

The non-volatile memory 66 stores printer interface firmware that is executed by the microcontroller 60 during initialization and operation of the printing device 26 to permit communications between the host device 12 and the printer 52 and optionally, to enhance operation of the printer by storing supplemental font files that allow the printer to print characters of different style and/or size and/or emulation files that allow the printer to emulate one or more other printer models.

The non-volatile memory 76 stores printer firmware that is executed by the microcontroller 70 during initialization and operation of the printing device 26 to allow the printer 52 to respond to commands generated by the host device 12 and print appropriate receipts when a transaction is completed. In this particular embodiment, the printer firmware includes a boot file, a main firmware file and a font file. The firmware also includes printer hardware and firmware identification information to enable the printer interface 50 to determine the type of printer 52 and the status of the resident printer firmware. For example, the printer hardware and firmware identification information includes the version string of the main firmware file, the version string of the boot file, the version of the font file and the printer model identification number (ID). The printer model ID is a single data byte, the value of which is unique to the printer.

In this particular embodiment, the printer interface 50 and the printer 52 make use of NAND memory. In view of the nature of this type of memory, both the printer interface 50 and printer 52 employ a memory block assessing and correcting procedure. For ease of description, the memory block assessing and correcting procedure employed by the printer 52 will be described with particular reference to FIGS. 3 to 6. It should be appreciated that the description applies equally to the memory block assessing and correcting procedure employed by the printer interface 50.

Figure 3:
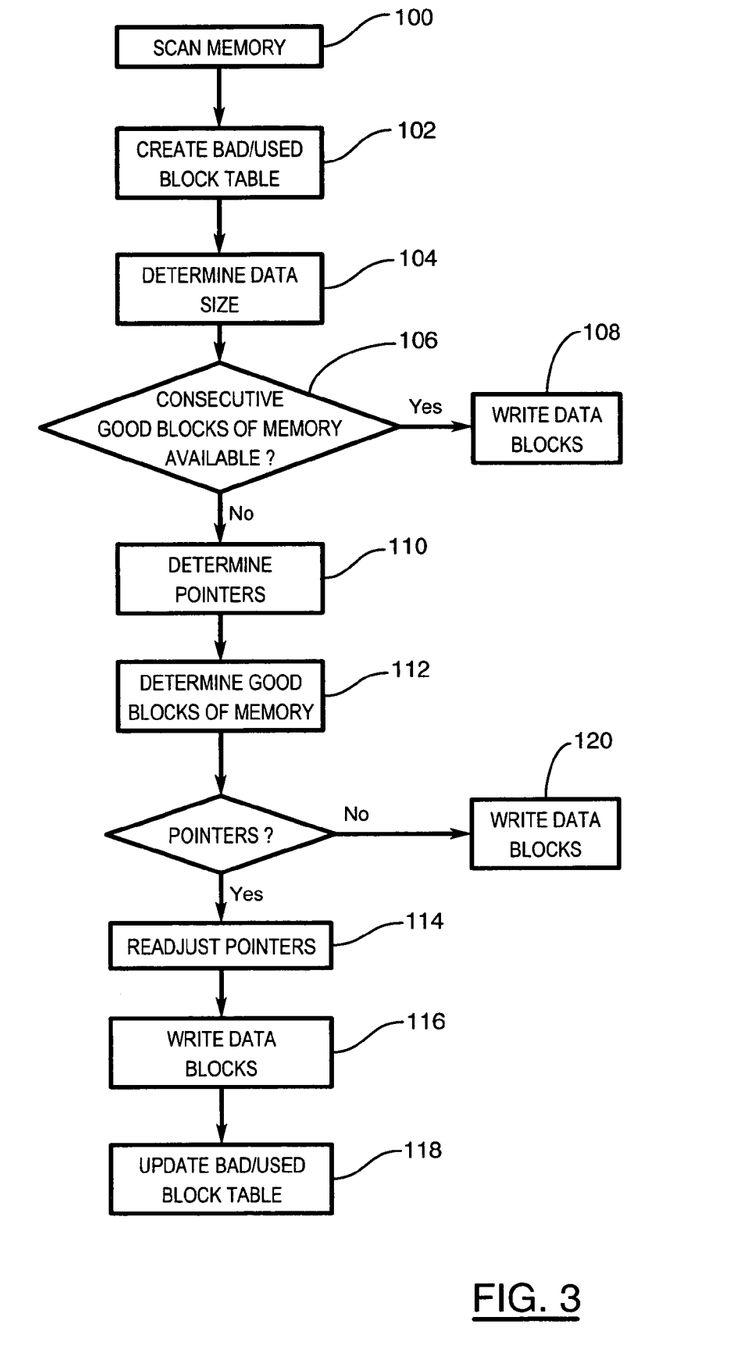
FIG. 3 is a flowchart showing steps performed by the printing device during a memory block accessing and correcting procedure.

At the time of first use, the NAND memory is scanned by the microcontroller 70 to determine bad blocks (step 100) and a bad/used block table is created that identifies the bad blocks of NAND memory (step 102). The bad/used block table is stored in the first and second identified good blocks of memory. During bad block determination, for each block, each byte or each column in the block (depending on the type of memory) is examined to determine its initial values. If the block is good, each byte in the block will have an FF hex value. Bad blocks will include bytes with non-FF hex initial values.

With the bad/used block table created and identifying bad blocks, during writing to memory, data blocks are written to blocks of the memory sequentially beginning with the first good block following the bad block table. During writing however, bad blocks of memory are skipped so that data blocks are only written to good blocks of memory. When data is received that is to be written to memory, the data is examined to determine how many blocks the data spans (step 104). If a consecutive sequence of good blocks of memory exists that can accommodate the data, the data blocks are simply written to those good blocks of memory (steps 106 and 108). If a consecutive sequence of good blocks of memory does not exist, the data is examined to determine if the data includes pointers (step 110). This is achieved by examining the data content to locate structures that include pointers such as for example headers with indices, or sequentially linked sectors. In the present embodiment, sector type identifiers are used to represent the type of sector data and therefore, the structure of the data is known. Knowing the data structure of course allows pointers in the data that require readjusting to be readily determined. The non-consecutive good blocks of memory to which the data blocks are to be written are then determined (step 112). If the data includes pointers, the pointers within the data blocks are adjusted so that the pointers do not point to skipped bad blocks but rather to good blocks of memory into which data blocks are to be written (step 114). Once the pointers in the data blocks have been adjusted, the data blocks are written to the memory (step 116). Following writing, the bad/used block table is updated to identify the blocks of memory used to hold the data blocks so that the used blocks are skipped during the next write (step 118). If the data blocks do not include pointers, the data blocks are simply re-written to the good blocks of memory (step 120).

By adjusting the pointers in the data blocks prior to writing of the data blocks to memory, speed during subsequent data reading is maintained since upon reading there is no need to re-adjust pointers. Re-adjusting pointers during data block readout can be time consuming.

Figure 4:
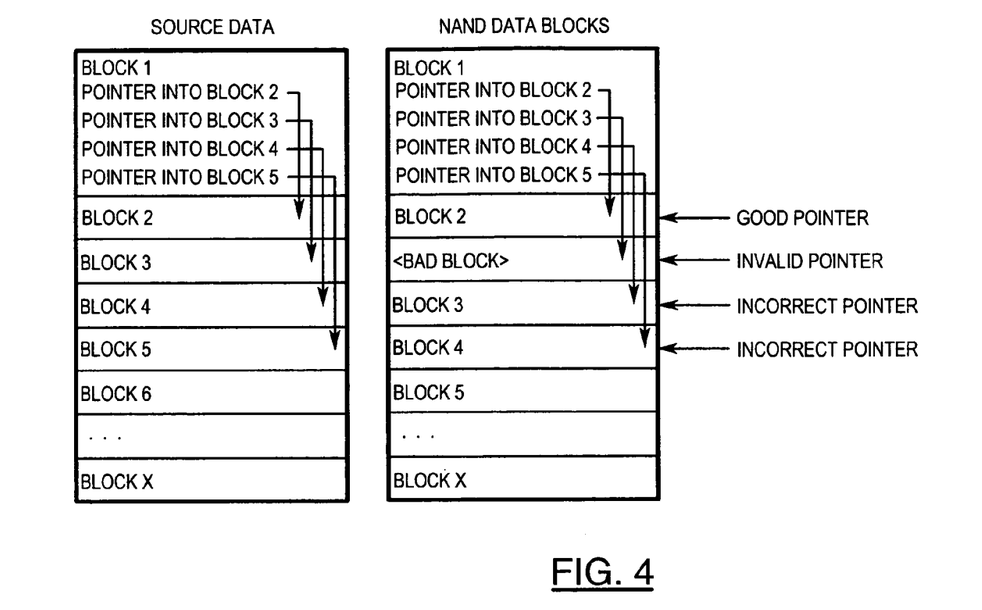
FIG. 4 shows pointer errors that arise when data blocks are written to memory including a bad block.

FIG. 4 shows an example of data blocks to be written to memory. The first block of data includes pointers pointing to data blocks 2, 3, 4, and 5. If the data blocks are written to x+1 blocks of NAND memory having a bad block at the block 3 location, the pointer in the first data block pointing to block 3 will be invalid and all pointers pointing to subsequent blocks will be incorrect.

Figure 5:
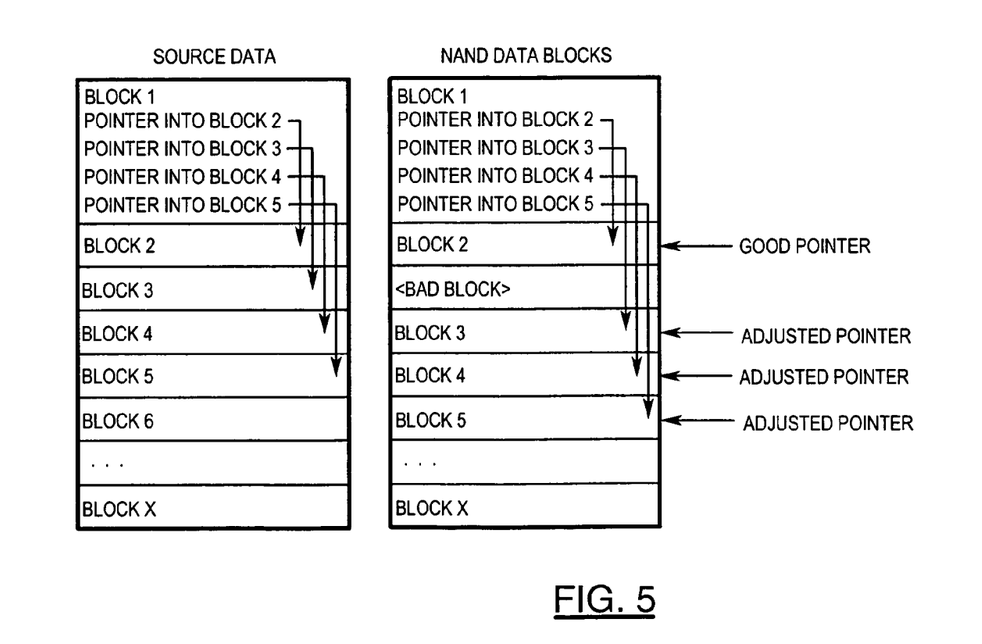
FIG. 5 shows pointer readjustments performed during the memory block accessing and correcting procedure to avoid pointer errors when writing to memory including a bad block.

FIG. 5 shows the data blocks of FIG. 3 wherein the pointers in the data blocks are readjusted to take the bad block into account in the manner described above.

Figure 6:
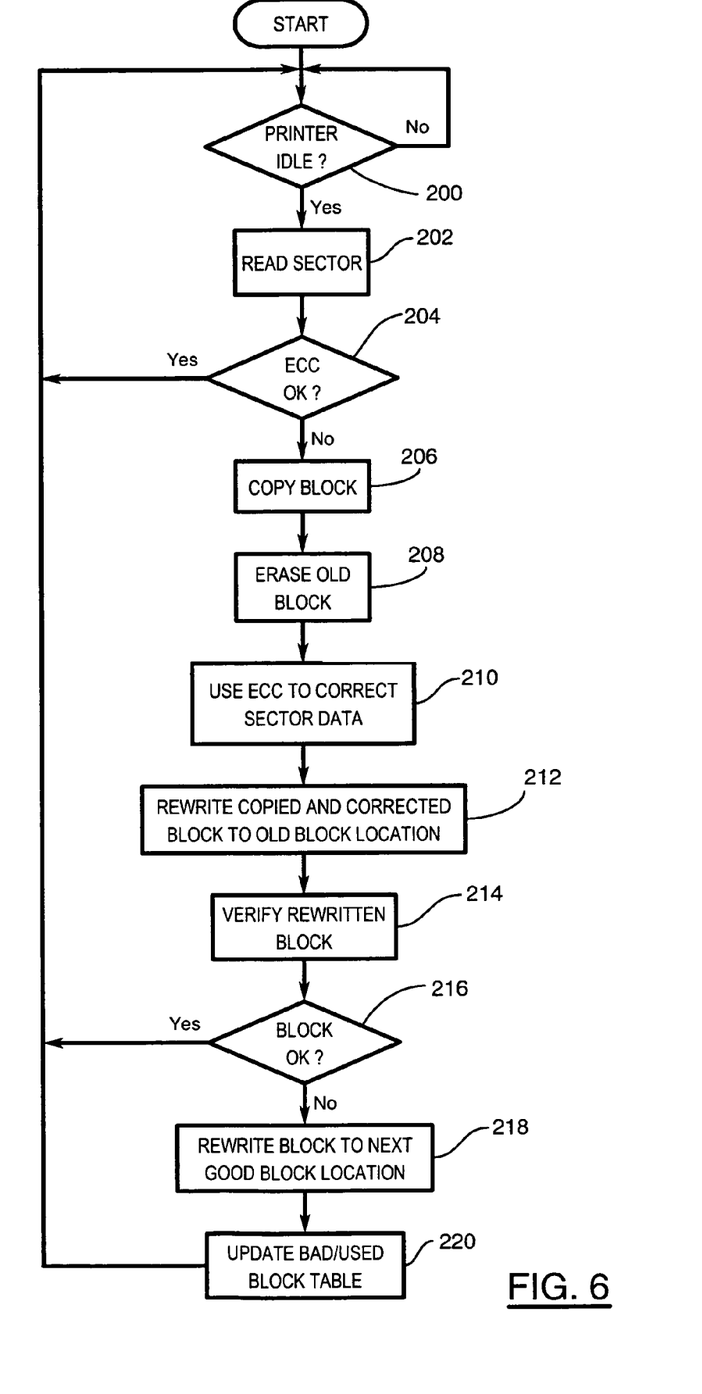
FIG. 6 is a flowchart showing additional steps performed by the printing device during the memory block accessing and correcting procedure.

In addition to the above memory management technique, during idle time of the printing device (step 200), the microcontroller 70 scans the memory to detect stored data blocks that may have become corrupted. During this process, the microcontroller selects a sector of memory and reads the sector (step 202). The microcontroller 70 then checks the ECC to determine if the sector is good (step 204). If so, the next sector is selected and the process is repeated.

If the ECC indicates that the sector is not good, the data block including the bad sector is copied to a new location (step 206). The original data block is then erased (step 208). The ECC is used to correct the sector error (step 210) and the corrected data block is re-written back to the original block location (step 212). The re-written block is then verified (step 214). If the re-written block has been corrected the microcontroller 70 reverts to step 200 and if the printer is idle, the next sector is read and the process is repeated. If the re-written block is bad, the corrected block is written to the next good block of memory (block 216) and the bad/used block table is updated (218).

The above process is performed generally continuously during printer idle times. In this manner, the printing device is able to correct memory errors before they become severe and data is lost.

Although specific reference is made to a printer used in a POS station, those of skill in the art will appreciated that this is for ease of illustration. The printer interface incompatibility detecting method is suitable for use in a variety of environments and with virtually any type of printer designed to accommodate a printer interface such as for example dot matrix printers, thermal printers, ink jet printers, laser jet printers etc.

Although an embodiment has been described, those of skill in the art will appreciate that the variations and modifications may be made without departing from the spirit and scope thereof as defined by the appended claims.

What is claimed is:

1. A printing device comprising:
   memory configured to store data in blocks; and
   a processing unit configured to communicate with the memory and, in response to a print job, to access the memory and extract data therefrom to be used to complete the print job, the processing unit further configured to perform a data block correcting procedure during printing device idle times, wherein the data block correction procedure comprises the acts of:
   a) reading a sector of the memory;
   b) employing an error correction code to detect if the sector includes an error;
   c) copying a data block including the sector having the detected error to a new location;
   d) employing an error correction code to correct the detected error and provide a corrected sector;
   e) rewriting the data block including the corrected sector back to its original location;
   f) verifying that the rewritten data block is error free using an error correction code; and
   g) if not error free, copying the rewritten data block including the sector having an error to a new location.

2. A printing device according to claim 1 wherein the printing device comprises a printer, the printer comprising a communications channel interface board and a printer control mechanism each configured to communicate with the processing unit.

3. A printing device according to claim 1 wherein the printing device comprises a printer interface, the printer interface comprising a host interface board and a printer interface board each configured to communicate with the processing unit.

4. A printing device according to claim 1 wherein the data extracted from the memory to be used to complete the print job comprises font data from a font file stored in the memory.

5. A printing device according to claim 1 wherein the act of employing error correction code to determine that the sector is bad comprises employing error correction code to determine that data stored in the sector has become corrupted.

6. A printing device according to claim 1 wherein the data block correcting procedure further comprises the act of:
   h) updating a bad/used block table stored in the memory to flag the original location of the rewritten data block as bad.

7. A printing device according to claim 6 wherein the data block correcting procedure further comprises the act of:
   i) repeating acts a)-h).

8. A printing device comprising:
   memory configured to store data and memory block status information in blocks; and
   a processing unit configured to communicate with the memory and, in response to a print job, to access the memory and extract data therefrom to be used to complete the print job, the processing unit further configured, during writing of data to the memory, to use the memory block status information so that data is only written to good blocks of memory during writing, the processing unit further configured to readjust pointers in data to be written to take into account bad blocks of memory that are skipped during writing.

9. A printing device according to claim 8 wherein the printing device comprises a printer, wherein the printer further comprises a communications channel interface board and a printer control mechanism each configured to communicate with the processing unit.

10. A printing device according to claim 8 wherein the printing device comprises a printer interface, the printer interface comprising a host interface board and a printer interface board each configured to communicate with the processing unit.

11. A printing device according to claim 8 wherein the processing unit is configured to update the memory block status information upon writing data to blocks of memory to identify used blocks, wherein the processing unit is configured to skip bad and used blocks during writing.

12. A printing device according to claim 11 wherein the memory block status information is stored in the memory in a table that is created when the memory is first used to thereby identify bad memory blocks.

13. A printing device comprising:
    non-volatile memory configured to store data and a bad/used block table in blocks; and
    a microcontroller configured to communicate with the memory and, in response to a print job, to access the memory and extract font data from the memory to be used to complete the print job, the microcontroller further configured, during writing of data to the memory, to perform a memory block assessing and correcting procedure, wherein the memory block assessing and correcting procedure comprises the acts of:
    scanning the memory to determine bad blocks;
    storing the locations of the bad blocks in the bad/used block table;
    receiving data that is to be written to memory; and
    examining the data to determine how many blocks the data spans.

14. A printing device according to claim 13 wherein the memory block assessing and correcting procedure further comprises the act of:
    determining that a consecutive sequence of good blocks of memory exists that can accommodate the data; and
    writing the data to the consecutive sequence of good blocks of memory.

15. A printing device according to claim 13 wherein the printing device comprises a printer, the printer comprising a communications channel interface board and a printer control mechanism each configured to communicate with the microcontroller.

16. A printing device according to claim 13 wherein the printing device comprises a printer interface, the printer interface comprising a host interface board and a printer interface board each configured to communicate with the microcontroller.

17. A printing device according to claim 13 wherein the memory block assessing and correcting procedure further comprises the act of:
    determining that a consecutive sequence of good blocks of memory that can accommodate the data does not exist; and
    examining the data to determine whether the data includes pointers.

18. A printing device according to claim 17 wherein the memory block assessing and correcting procedure further comprises the acts of:

determining that the data includes pointers;
adjusting the pointers within the data so that the pointers do not point to bad blocks of memory but rather to good blocks of memory;
writing the data to the good blocks of memory; and
updating the bad/used block table to identify the blocks of memory used to hold the data blocks so that the used blocks are skipped during the next write.

19. A printing device according to claim 17 wherein the memory block assessing and correcting procedure further comprises the acts of:
determining that the data does not include pointers; and
writing the data to good blocks of memory.

* * * * *

UNITED STATES PATENT AND TRADEMARK OFFICE
CERTIFICATE OF CORRECTION

| | | |
|---|---|---|
| PATENT NO. | : 7,509,526 B2 | Page 1 of 1 |
| APPLICATION NO. | : 10/949869 | |
| DATED | : March 24, 2009 | |
| INVENTOR(S) | : Leonard B. Hodder | |

It is certified that error appears in the above-identified patent and that said Letters Patent is hereby corrected as shown below:

Column 7,
Line 9, please change "correction" to --correcting--
Line 42, please change ";" to --:--

Signed and Sealed this

Twenty-sixth Day of May, 2009

JOHN DOLL
*Acting Director of the United States Patent and Trademark Office*